United States Patent [19]

Shei et al.

[11] Patent Number: 5,703,788
[45] Date of Patent: Dec. 30, 1997

[54] CONFIGURATION MANAGEMENT AND AUTOMATED TEST SYSTEM ASIC DESIGN SOFTWARE

[75] Inventors: Darlene Shei, Milpitas; Jiurong Cheng, Sunnyvale, both of Calif.

[73] Assignee: LSI Logic Corporation, Milpitas, Calif.

[21] Appl. No.: 477,490

[22] Filed: Jun. 7, 1995

[51] Int. Cl.⁶ .............................. G06F 17/50; G06F 19/00
[52] U.S. Cl. .................................................. 364/488
[58] Field of Search .............................. 364/488, 489, 364/578; 395/500, 701, 702

[56] References Cited

U.S. PATENT DOCUMENTS

| | | | |
|---|---|---|---|
| 5,005,136 | 4/1991 | Van Berkel et al. | 364/490 |
| 5,197,016 | 3/1993 | Sugimoto et al. | 364/490 |
| 5,558,532 | 9/1996 | Jun et al. | 364/491 |

OTHER PUBLICATIONS

"Integrated VLSI CAD Systems at Digital Equipment Corporation" by A.F. Hutchings et al., IEEE 22nd Design Automation Conference, 1985, pp. 543–548.

*Primary Examiner*—Vincent N. Trans
*Attorney, Agent, or Firm*—Oppenheimer Poms Smith

[57] ABSTRACT

A software configuration management and test System for tracking and testing an ASIC design software package includes a library of test programs, an autodetector, an autoverifier, a failure report generator, and a package information logger. The System automatically selects which tests to run on the tools package depending on which portions of which tools have been updated, and then automatically sequences the tools package through the selected tests. By automating the testing process, the System achieves automation, standardization, completeness, and a systematic approach to testing. By greatly reducing test turnaround time, the System also facilitates concurrent engineering.

19 Claims, 4 Drawing Sheets

5,703,788

CONFIGURATION MANAGEMENT AND AUTOMATED TEST SYSTEM ASIC DESIGN SOFTWARE

BACKGROUND OF THE INVENTION

1. Field of the Invention

The present invention relates to the field of software control. More particularly, the present invention relates to the field of configuration management and automated test systems for Application Specific Integrated Circuit design software.

2. Description of the Related Art

Application Specific Integrated Circuits (ASICs) are semi-custom integrated circuits used extensively in the computer and electronics industry to achieve high levels of functional integration onto a single computer chip. When first manufactured, an ASIC die contains unconnected transistors, up to several hundred thousand in number. The chip is then customized by selectively adding strips of metal film that connect gates together to form the desired logic blocks. The metalization pattern thus determines the functionality of the chip.

Typically, an ASIC vendor provides to the user, an electronics design engineer, an extensive software package (a "release") that includes all of the software tools needed to design the ASIC and verify the design. These tools may include among many others: schematic capture and/or Very High Level Design Language (VHDL) translator; netlister; test vector generator; circuit simulator; electronic design rules checker; node conflicts checker; place and route; post-route simulator; simulation result display; logic output verifier; timing verifier; and critical path analysis. All of these tools work together to assure the user that the design file that he creates and then delivers to the vendor is correct, so that the ASIC the vendor builds will perform all of the functions required and at the performance level required.

The release contains a tremendous amount of software. For example, a typical release may comprise over two hundred executable program modules ("binaries") and shared modules ("archives"). The archives contain commonly shared subroutines or sets of data on which the binaries operate. More than fifty in-house software developers may be required to write and maintain the various software tools within a release. The tools are highly interdependent. A change in the way that one operates can make it incompatible with others until corresponding changes are made in those others. Therefore, it is essential that any change to a package be thoroughly tested to ensure correct operation of the entire package before the package is released to a customer.

ASIC tools and technology is a highly competitive, "leap-frog" business in which old hardware technology and software is rapidly obsoleted by competing products. Extremely fast turnaround time for software updates is therefore essential. In addition, when a user discovers an error ("bug") in the software package, the bug must be fixed and a corrected package shipped to the user quickly so that the user experiences a minimum of down time in his own design cycle.

This need for a fast turn around time, coupled with the complexity of the software and the highly interdependent nature of the tools and components thereof, creates a need to (1) test the package extensively, quickly, and reliably each time any change is made, (2) debug any errors quickly, and (3) control and track what versions of what modules are contained in a package.

In the past, testing and configuration control has been performed largely manually. For example, when the software programmer who was responsible for the netlister module would make an update to his module, he would test the new version of his module to his own satisfaction. Then, he would notify those other software programmers whose modules interact with the netlister, who would in turn test their own modules for compatibility with the new netlister. If any of the modules produced an incorrect output, the developer would trace the source of the incorrect result back until the ultimate source of the error was identified. This process might be repeated several times until all developers involved were satisfied that the new version was fully compatible with their modules. A Software Quality Assurance (SQA) department might then be contacted to perform additional tests on the updated module. Only then would the new package be released for shipment to users, with all of the component modules that make up the package being recorded and stored for tracking and archival purposes.

There are several disadvantages to this method of test and configuration control. First, it is not easy to ensure that the new module is thoroughly tested for proper operation, either by itself or with the rest of the package. The current method relies heavily on each developer's estimate as to which functions might have been affected and therefore need to be tested, and each developer's report that he actually tested those functions. This creates risk for the vendor, especially when personnel changes make a developer responsible for a module that is new and unfamiliar to him. A bug or other incompatibility that slips through the testing process and becomes part of a package that gets released to a user can result in tools that "crash," or faulty ASICs being produced and incorporated into end products resulting in tremendous financial loss for the customer and great embarrassment for the vendor. A vendor who develops a reputation for faulty tools and unreliability will quickly be forced out of the ASIC business. While it is conceivably possible to run all possible tests on the entire package any time a change is made, such "brute force" testing would be highly inefficient.

Second, the current test method is time consuming. The vendor must identify those software developers whose modules are potentially affected, and have each of them verify the new package by running those tests which, in their estimations, are required. If any potentially affected developer is not immediately available to perform the testing and evaluate the results, the update process will come to a halt. If an error is uncovered, it must be traced backwards until its source is located. This update process must be repeated for each module that is to be updated, either to fix identified bugs or to incorporate new features and capabilities in the next release. This process can therefore become a major bottleneck in getting improved and updated versions of the product approved for both internal use and further development, and for release to users.

Third, because of the many modules involved and the many tests that must be run on these modules, it is difficult to keep track of what module versions are contained within a given package, and what tests have been run on that package. Because a package may contain a large number of binaries and archives, the overall package may change daily. It is essential that changes be tracked, tested, and logged in an orderly manner.

Under the present pressures to get updated tools to market quickly, it is extremely difficult to test systematically, coordinate among all of the many potentially affected developers, and keep accurate records of test results and package versions. The result is often a chaotic development environment in which a tools package can change daily, with developers never being sure that their modules have been adequately tested for compatibility with the latest versions of other modules. A need exists therefore for an ASIC software tools testing and configuration management system that can efficiently test the various modules within a software package for proper operation both by themselves and with other modules, assist in tracing back any errors to the source of those errors, and provide an orderly approval and release system for updated packages.

SUMMARY OF THE INVENTION

The ASIC design software configuration management and test system (the System) of the present invention includes a library of test programs, an autodetector, an autoverifier, a failure report generator, a tools archiver, and a package information logger.

When the developer of a software module completes an update to the module to his own satisfaction, he then submits the updated module to the System. The autodetector, which is a key feature of the present invention, detects that an updated module has been submitted, identifies the changes that have been made to the module, and based on that information, selects a suite of tests from the test library, so as to ensure that every function that may be affected by the change is thoroughly tested but that no unnecessary tests are run. In this way, the System ensures thorough testing while minimizing test turn-around time.

The System sequentially executes the test suite on the updated software package to verify that it operates properly. The automatic sequential testing, performed automatically by the System, replaces much of the laborious, time consuming, and error-prone manual testing previously employed.

If any test fails, the System generates failure reports to be used by the developer in tracing the failure back to its source. If all the tests pass, the System gives its approval for use of the new overall package, either for internal development use or for release to users. The System also archives the updated tool, and logs the version numbers of the tools that comprise the new release package, the package build date, what tests were run on the new package, and the results of those tests.

By automating the testing process, the System achieves automation, standardization, thoroughness, and a systematic approach to testing. Automating the testing process also greatly reduces test turn-around time. This allows software developers working on interdependent tools to work more in parallel (concurrently) than previously possible, further reducing the amount of time that a vendor of software tools requires to update a product and move that product to market. Also, by including both outputs and internal states in the failure reports, the system also assists a software developer in tracing back a software test failure to the source of that failure. Furthermore, by automatically logging relevant information about all software tools packages that are used, the System provides a systematic method of records keeping that reduces much of the chaos in the software tools development environment.

DESCRIPTION OF THE DRAWINGS

The present invention is explained below by means of examples with reference to the following figures of which.

DETAILED DESCRIPTION OF THE PREFERRED EMBODIMENTS

Figure 1:
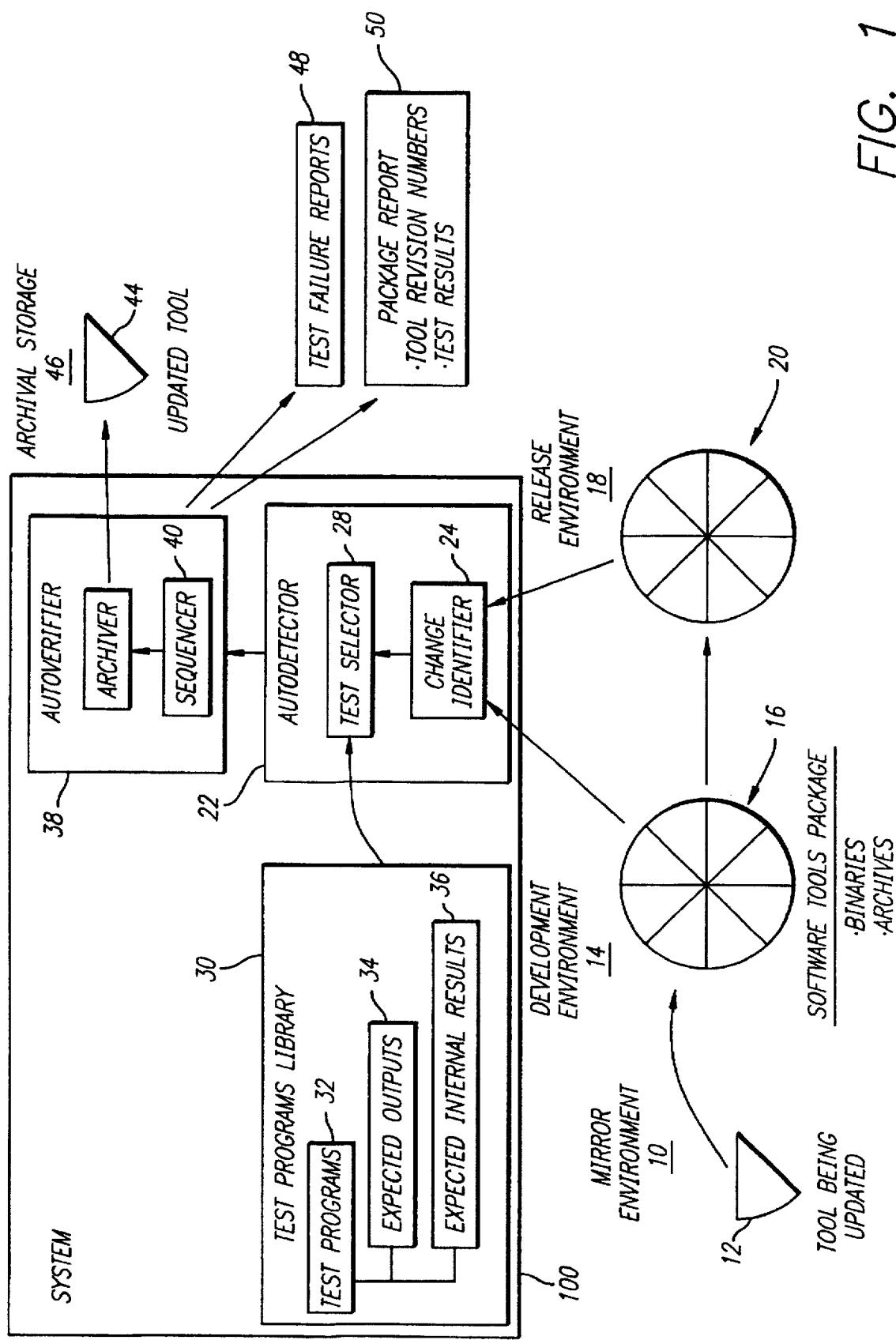
FIG. 1 illustrates how the System works in conjunction with the various programming environments in a preferred embodiment.

FIG. 1 illustrates the major components of the System 100 of the present invention, and how the System 100 works in conjunction with the various programming environments. System 100 comprises an Autodetector 22, an Autoverifier 38, and a library 30 of various test programs. The Mirror Environment 10 is that area in which a software developer writes, tests, and edits his software tool 12 until he is satisfied with it. When he is satisfied, he moves the updated tool into Development Environment 14. Development Environment 14 is the common area containing what is believed to be the latest operational version of an entire software tools package 16.

It is to be understood that references herein to an updated tool 12 within a package of software tools 16 also encompasses an updated code section within what a vendor may call a single tool. It is immaterial for purposes of the present invention whether the complete software package 16 that must be tested and verified is termed a set of tools containing multiple interdependent tools 12, or a single tool containing multiple interdependent functions. For simplicity and clarity, the present discussion uses the example of an updated tool 12 within a package of tools 16. It is further to be understood that the term "interdependent tools" as used herein denotes only at least partial interdependency, and does not require that every tool be dependent upon every other tool.

Autodetector. Autodetector 22 detects when a change has occurred in Development Environment 14 and selects an appropriate suite of tests to run on package 16 to verify that package 16 operates properly.

Autodetector function 22 is continuously checking Development Environment 14 for any change to package 16. Autodetector 22 identifies changes to Development Environment 14 using any of various techniques such as: comparing checksums, Cyclic Redundancy Codes (CRCs), or compiler time stamps; or may be automatically invoked any time Development Environment 14 is written to. Regardless of the technique used, after the developer has transferred his updated tool 12 into Development Environment 14, Autodetector 22 detects that a change has occurred and initiates Change Identifier subfunction 24.

Change Identifier. Change Identifier subfunction 24 identifies the portion or portions of a package 16 that have changed within Development Environment 14. Change Identifier 24 includes the Unix utility RCS, which compares new tool 12 to the prior version line by line, and identifies specifically which lines of code have changed or been added in the updated version of tool 12. Change Identifier 24 also includes a first look-up table that maps each line of code within tool 12 to the subroutine in which that line of code resides, this first look-up table being automatically generated every time a tool 12 is compiled. By mapping every changed line to a changed subroutine, Change Identifier 24 identifies every subroutine that has been changed.

Test Selector. Once the changed subroutines have been identified, a Test Selector subfunction 28 selects an appropriate suite of test programs from test programs library 30 to run, based on those tools that have changed. Test Selector 28 includes a second look-up table, which maps every subroutine within package 16 to at least one test program 32. This second look-up table is previously constructed by running each test program 32 within library 30 through tools package 16, and determining what subroutines each test program 32 exercises. For example, if test programs 4 and 7 within test programs library 30 exercise subroutine A, then this second look-up table will map subroutine A to test programs 4 and 7. This second look-up table may be constructed with the aid of standard software tools well known in the art that automatically record what subroutines are exercised by what test programs.

Because the first look-up table maps identified lines of code to subroutines, and the second look-up table maps identified subroutines to test programs, together these two tables map identified lines of code to test programs. Using these look-up tables, Autodetector 22 detects when a change has taken place, identifies the lines of code that have changed, and selects a suite of test programs 32 with which to test the changed code.

Ideally, each test program 32 exercises a portion of an identified subroutine, and all upstream and downstream subroutines. Upstream subroutines are those that supply data to the identified subroutine. Downstream subroutines are those that use data produced by the identified subroutine. Thus, when the suite of all test programs 32 that test an identified subroutine is selected, the selected test suite thoroughly exercises not only the identified subroutine but all upsteam and downstream functions. By testing all upstream and downstream functions, the System ensures that the subroutine containing the changed code not only performs its own task properly, but remains Compatible with the rest of tools package 16. Ideally, each test program 32 tests a unique functional flow through tools package 16, so as to minimize testing redundancy within any selected test suite.

Each test program 32 may include a test case with associated test case inputs, expected outputs 34, and expected internal results 36. Expected outputs 34 and expected internal states 36 are compared to actual outputs and internal states. A mismatch constitutes a test failure. Some test programs 32 may include only test case inputs designed to trigger any internal errors that may occur such as memory conflicts, and will not include an associated set of expected outputs.

The System may also include means by which a human operator can add or delete tests to the test suite, or specify the order of tests to be performed. For example, a developer may wish to verify that the updated package will pass a particular test before subjecting the package to the entire suite of tests.

After a change is made, it is not strictly necessary that complete testing be initiated immediately. Some or all of the test suite may be scheduled to run immediately to provide a minimal level of confidence in the updated package, with others being schedule to run overnight with results available the next morning. One advantage to scheduling tests to run overnight is that this avoids unnecessarily burdening computer resources during high use daytime hours. Depending on how long it takes to run an entire test program library 30 on updated package 16, the entire library 30 may be scheduled to run either overnight or less often.

Autoverifier. Autoverifier 38 includes a Sequencer subfunction 40 that automatically sequences updated package 16 through the test suite selected by the Test Selector.

Although in most cases the tests results can be verified automatically, manual verification of the test outputs may be required for certain outputs. For example, if the tool being tested is a user interface such as an graphical logic analyzer, a human must verify that the displayed output is as desired. If all tests pass, software tool Archiver subfunction 42 creates a copy 44 of updated tool 12 in an archival storage area 46 such as on magnetic tape. By storing a copy 44 of each tool 12 as it is updated and verified, Archiver 42 ensures that any working package that has ever been compiled can be recreated if necessary for debug purposes.

Failure Reports. If any test fails, Autoverifier 38 generates appropriate failure reports 48. Preferably, the failure reports 48 include comparisons of expected versus actual internal states, as well as comparisons of expected versus actual outputs. Reporting internal states as well as outputs states is known as "white box" testing, as opposed to "black box" testing which examines outputs. Such white box testing greatly facilitates the tracing of errors to their sources.

package Report. If all tests pass, Autoverifier 38 also generates a package report 50. Package report 50 can include information such as the revision numbers of all the tools within package 16, the synchronization of complete package 16, the package build date, what tests were run on package 16, and the results of those tests.

Release Environment. In addition to monitoring Development Environment 14, Autodetector 22 also continuously monitors Release Environment 18 for any changes. Release Environment 18 is that area in which the versions of packages 20 that will be shipped ("released") to a customer are tested and maintained. If any change is detected in Release Environment package 20, Autodetector 22 initiates testing similar to that performed on Development Environment package 16. While Development Environment package 16 may be changing daily, Release Environment package 20 is usually much more stable. Updated tools can be transferred from Development Environment 14 to Release Environment 18 in response to any one of several conditions, including a release being scheduled to occur on a given date or a developer transferring his updated tool 12 to Release Environment 18.

Figure 2:
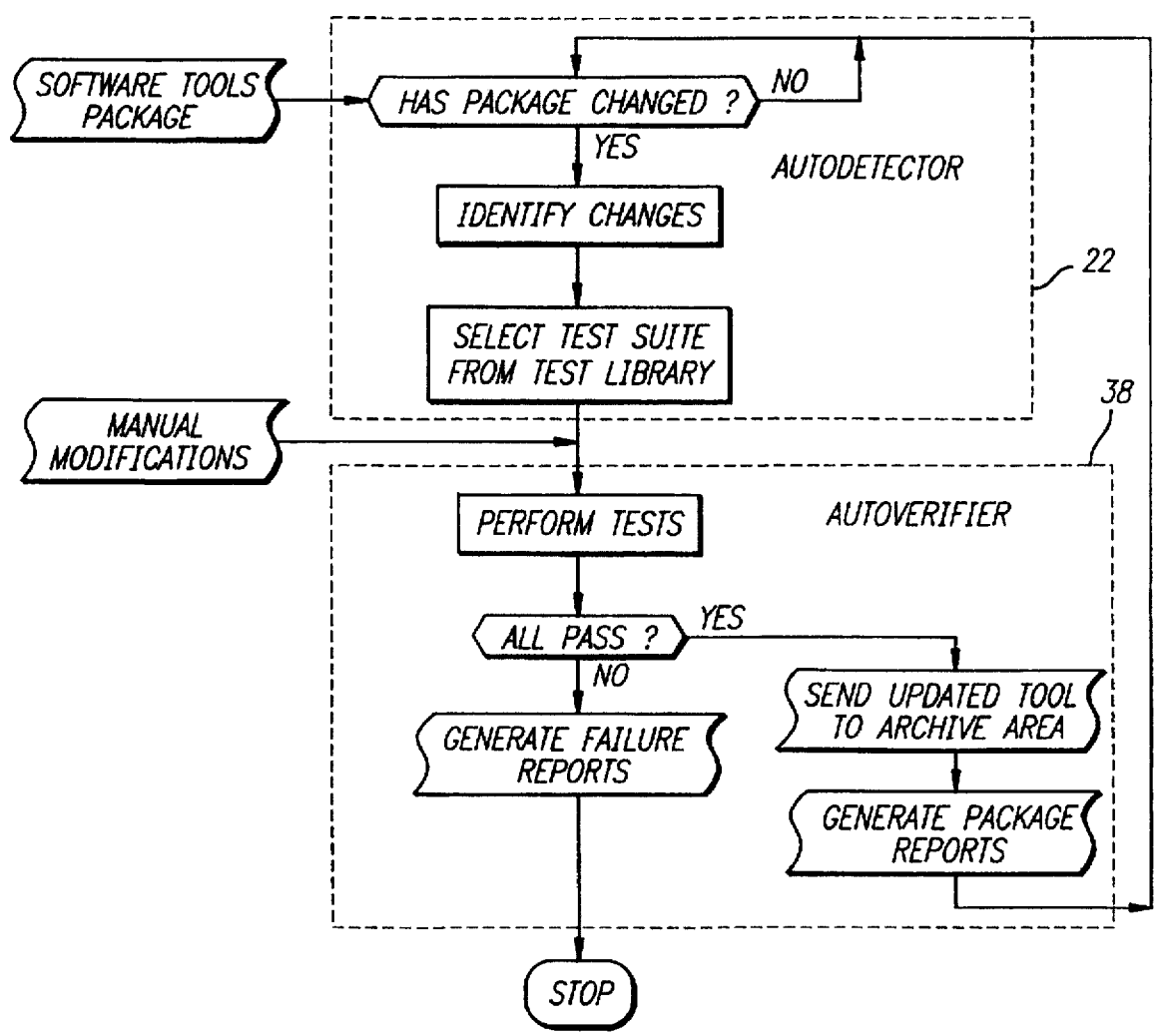
FIG. 2 is a flow diagram of a System according to a preferred embodiment.

FIG. 2 is a flow chart illustrating a preferred embodiment of Autodetector 22 and Autoverifier 38 functions. Autoverifier 22 monitors the software tools packages in both Development Environment 14 and in Release Environment 18. When a change is detected, Autodetector 22 identifies the change and selects the appropriate suite of tests 32 from test program library 30. If desired, an operator manually modifies the test suite, its order of execution, or its scheduling. Autoverifier 38 then sequences the tools package through the selected test suite. If all tests pass, Autoverifier 38 sends a copy of updated tool 12 to an archive area for permanent storage, and generates package report 50 (FIG. 1). If a test fails, Autoverifier 38 generates appropriate failure reports 48 (FIG. 1).

Figure 3:
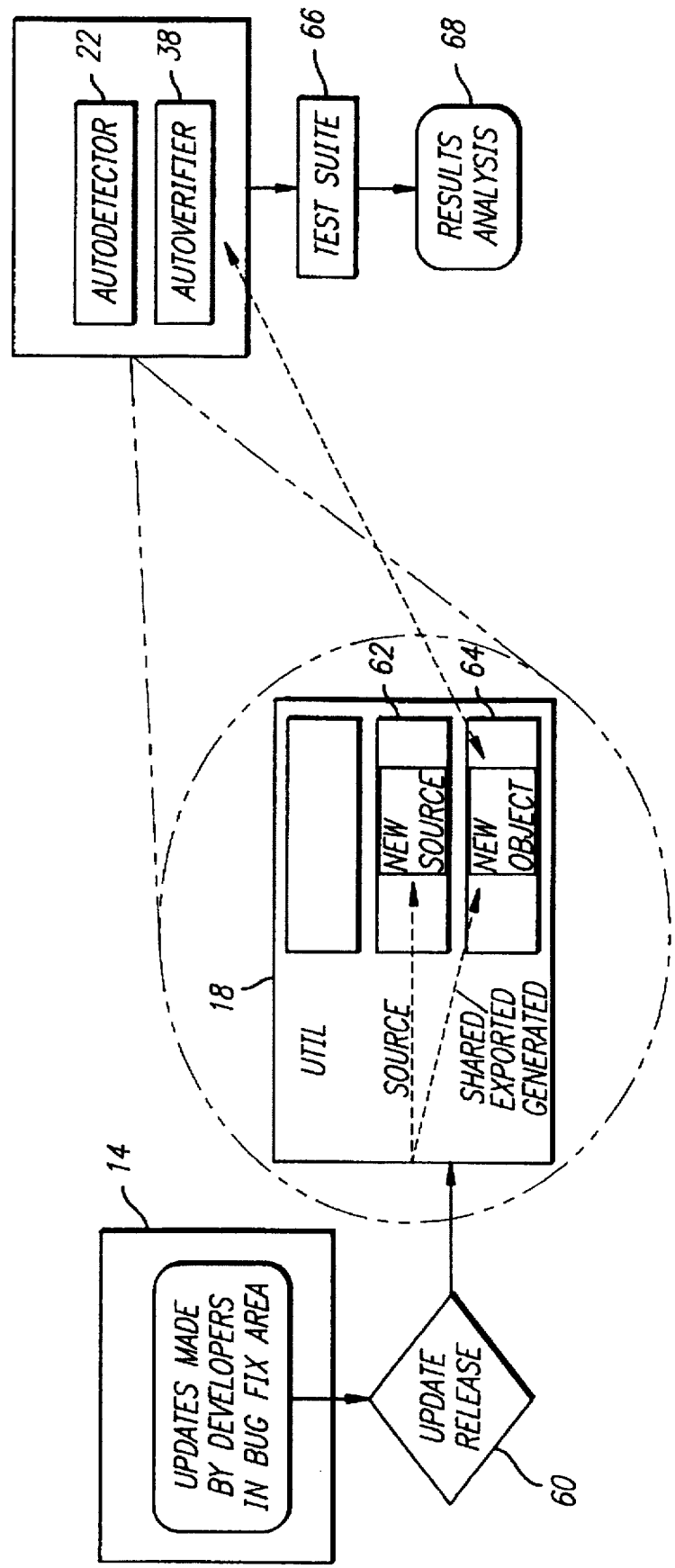
FIG. 3 illustrates how the autodetector and autoverifier monitor the release environment in a preferred embodiment.

FIG. 3 illustrates graphically an example of how Autodetector 22 and Autoverifier 38 functions operate on a Release Environment 18. Autodetector 22 detects when an updated tool is moved from Development Environment 14 to Release Environment 18 in response to a decision 60 to create an updated release. New object code 64 is generated from new source code 62, where the new source code comprises the updated software tool 12 (FIG. 1). The test suite 66 is then selected from test programs library 30 (FIG. 1) and initiated. Results analysis 68 is then conducted, either manually or automatically, to determine whether the release package 20 (FIG. 1) in Release Environment 18 is operating properly.

Figure 4:
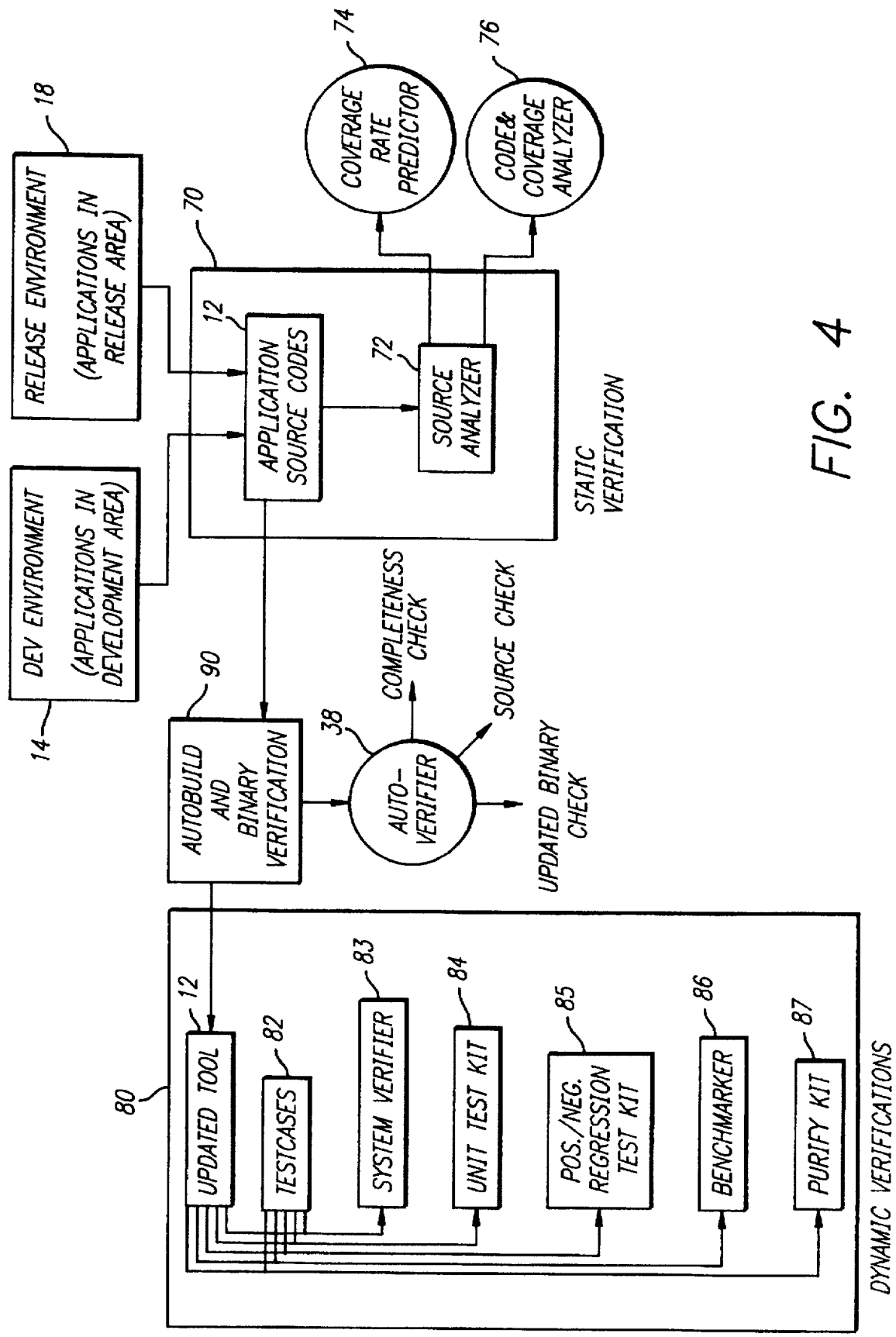
FIG. 4 illustrates typical tests that may be included in a library of test programs.

FIG. 4 illustrates in greater detail the testing process of a preferred embodiment and typical tests that are performed. Test library 30 (FIG. 1) includes static verification tests 70 and dynamic verification tests 80. Static verifications 70 are those tests that can be run on the updated tool (application) 12 source code itself without the need for test case inputs. These static verifications includes a source analyzer 72 comprising a coverage rate predictor 74 and a code & coverage analyzer 76. Coverage rate predictor 74 predicts what percentage of the lines of software within a tool will be exercised by a given test case. Ideally a test case exercises and thus verifies one hundred percent of the code lines within a software tool. Coverage rate predictor 76 analyzes what portions of the software within a tool will and will not be exercised by a given test case. This helps a developer modify his module or the test case to increase the coverage rate.

If updated tool 12 passes static tests 70, it is passed along to Autobuild and Binary Verification function 90. This function selects which dynamic tests 80 to run on a package, depending on which module(s) have changed. It also checks to ensure that all binaries and archives are synchronized, and ensures that the package contains all of the items listed in the bill of materials to be sent to the customer user. This function also includes Autoverifier 38.

The System then performs Dynamic Verifications 80. These tests exercise updated tool 12 using test case inputs 82. For example, in a typical system a System Verifier 83 checks for upward compatibility and ensures that the layout task completes smoothly; a Unit Test Kit 84 contains methods and standards for carrying out the unit test; a Regression Test Kit 85 includes a Positive Regression Test, which verifies that the updated package performs all of the functions that the prior package did, and a Negative Regression Test, which verifies that any new functions are performed properly, and without crashing or core dumping; a Benchmarker 86 checks system performance to ensure that the changes have not negatively impacted tool performance; a Purify Kit 87 helps to identify memory related problems such as memory uninitialization or leaks. Using coverage rate actually obtained using dynamic tests 80 as a baseline, Coverage Rate Predictor 72 predicts the maximum coverage rate achievable for a software tool 12 undergoing future modifications.

Many steps involving many tools are required to design and verify ASICs. Accordingly, the examples given above of ASIC design tools and tool verification tests are by no means exhaustive, and are meant to be illustrative only.

In the above discussion, a digital ASIC has been used to illustrate the principles of the present invention. However, the present invention is equally applicable to design and development tools for other integrated circuits. For example, whereas a digital ASIC contains logic gates, an analog ASIC may contain operational amplifiers, resistors, capacitors, power transistors, and the like. The tools for simulating these components will include an analog simulator such as SPICE rather than a digital logic simulator, and the present invention may be applied to such analog simulation tools with similar gains in efficiency and reliability. The present invention may also be used with integrated circuit types other than ASICs, such as full custom digital or analog circuits, or programmable logic devices (PLDs). The present invention may also be used to enhance reliability and turnaround time in the development of interdependent software tools other than integrated circuit design tools. Any package of software tools that is complex and interdependent will benefit by automatic, systematic, and standardized testing to ensure reliability and enhance engineering concurrency.

Thus, although the present invention has thus been described in detail with regard to the preferred embodiments and drawings thereof, it should be apparent to those skilled in the art that various adaptations and modifications of the present invention may be accomplished without departing from the spirit and the scope of the invention.

Accordingly, it is to be understood that the detailed description and the accompanying drawings as set forth hereinabove are not intended to limit the breadth of the present invention, which should be inferred only from the following claims and their appropriately construed legal equivalents.

What is claimed is:

1. An apparatus for facilitating the operational reliability of a library of modules indicative of a set of interdependent software tools that cooperate with one another to enable a logic system designer to interconnect a plurality of integrated circuits for achieving a high level of functional integration therebetween, comprising:

autodetector means for automatically detecting a module submission to the library of modules;

autoverifier means for determining whether said module submission has a previously submitted archived module within the library of modules;

modification identification means responsive to said verification means for comparing and identifying functionality changes between said module submission and said previously submitted archived module;

module selection means responsive to said modification identification means for assembling an exclusive set of previously submitted archived modules with interdependence on said module submission;

function identification means responsive to said module selection means for sequentially identifying individual functions in each individual previously submitted archived module in said exclusive set interdependent upon the identified functionality changes between said module submission and said previously submitted archived module;

module testing means responsive to said function identification means for testing sequentially each identified function to verify its proper functional operation relative to each identified functional change between said module submission and said previously submitted archived module: and error reporting means responsive to said module testing means for generating a failure report that identifies each function that failed to perform its proper functional operation due to each individual one of the identified functional changes between said module submission and said previously submitted archived module.

2. The apparatus of claim 1, further comprising:

system use reporting means for generating an approval indication that the identified functionality changes between said module submission and said previously submitted module have been tested and verified for proper functional operation relative to each individual function tested by said module testing means.

3. The apparatus of claim 2, said autodetector means further comprising:

means for automatically identifying lines of code within said design tools that have changed.

4. The apparatus of claim 3, wherein said module selection means includes:

interdependency identifying means for determining whether individual ones of the previously submitted archived modules have an interdependence on said module submission;

said interdependency identifying means including:

a first mapping means for mapping a line of code within said previously submitted archived module to a subroutine within which said line of code resides; and a second mapping means for mapping said subroutine to test programs within said library that exercise said subroutine.

5. A system for automatically testing and verifying the operational reliability of a library of interdependent software tools, comprising:

change identifier means for automatically identifying any modification in the library of interdependent software tools; and sequential tester means responsive to said change identifier means for automatically selecting and testing sequentially each interdependent software tool affected by the identified modification.

6. A system according to claim 5, wherein said sequential tester means includes:

mapping means responsive to said change identifier means for automatically selecting individual ones of a suite of test programs that exercise functions of software tools upstream and downstream from any identified modifications and for automatically mapping the selected software tools to selected ones of the test programs that exercise functions of individual ones of the software tools selected from said library.

7. A system according to claim 6, wherein said interdependent software tools include integrated circuit design software tools.

8. A system according to claim 7, wherein the integrated circuit design tools are ASIC design tools.

9. A system according to claim 8, further comprising:

autoverifier means responsive to said tester means for generating an approval report whenever all the tested interdependent software tools affected by the identified modification operate in a functionally correct manner and for generating an error report identifying each software tool that fails to operate in a functionally correct manner.

10. A system according to claim 9, wherein said error report includes an indication of the outputs and internal states of the selected interdependent software tools.

11. The system of claim 10 further comprising:

a package information logger for logging software tools package information.

12. The system of claim 11, said software tools package information comprising:

software tools version numbers; and test results.

13. The system of claim 12 further comprising:

a software tool archiver for storing software tool revisions.

14. A method of automatically testing and verifying the operational reliability of a library of interdependent software tools, comprising: identifying automatically any modification in the library of interdependent software tools;

selecting automatically each interdependent software tool affected by the modification;

selected automatically from a library of software test programs a suite of test programs to test each interdependent software tool affected by the modification; and testing each selected interdependent software tool with selected ones of the suite of test programs.

15. A method according to claim 14, wherein the step of selecting a suite of test programs includes: mapping the selected software tools to selected ones of the test programs to exercise the software tool functions affected by the modifications.

16. A method according to claim 15, wherein the interdependent software tools are integrated circuit design tools.

17. A method according to claim 16, wherein the integrated circuit design tools are ASIC design tools.

18. A method according to claim 17, further comprising generating automatically a failure report, said failure report including indications of outputs and internal states of the interdependent software tools.

19. A method according to claim 18, further comprising:

logging software tool package information.

* * * * *